(12) United States Patent
Lee et al.

(10) Patent No.: US 12,259,286 B2
(45) Date of Patent: Mar. 25, 2025

(54) MULTI-MODAL SENSING TRANSDUCERS

(71) Applicant: INTERLINK ELECTRONICS, INC., Camarillo, CA (US)

(72) Inventors: Cheng Seong Lee, Singapore (SG); Chee Wai Lu, Singapore (SG)

(73) Assignee: INTERLINK ELECTRONICS, INC., Irvine, CA (US)

( * ) Notice: Subject to any disclaimer, the term of this patent is extended or adjusted under 35 U.S.C. 154(b) by 1246 days.

(21) Appl. No.: 16/618,997

(22) PCT Filed: Jun. 6, 2018

(86) PCT No.: PCT/US2018/036240
§ 371 (c)(1),
(2) Date: Dec. 3, 2019

(87) PCT Pub. No.: WO2018/226816
PCT Pub. Date: Dec. 13, 2018

(65) Prior Publication Data
US 2021/0148770 A1 May 20, 2021

Related U.S. Application Data

(60) Provisional application No. 62/516,929, filed on Jun. 8, 2017.

(51) Int. Cl.
| | |
|---|---|
| *G01L 1/18* | (2006.01) |
| *B25J 13/08* | (2006.01) |
| *B60J 5/10* | (2006.01) |
| *H01H 3/02* | (2006.01) |
| *H10N 30/30* | (2023.01) |

(52) U.S. Cl.
CPC ............... *G01L 1/18* (2013.01); *B25J 13/085* (2013.01); *B60J 5/10* (2013.01); *H01H 3/0213* (2013.01); *H10N 30/302* (2023.02); *H01H 2239/078* (2013.01)

(58) Field of Classification Search
CPC .... G01L 1/18; G01L 1/142; G01L 1/16; B25J 13/085; B60J 5/10; H01H 3/0213; H01H 2221/05; H01H 2239/074; H01H 2239/078; H03K 17/955; H03K 17/962; H10N 30/302
USPC ..................................................... 73/862.625
See application file for complete search history.

(56) References Cited

U.S. PATENT DOCUMENTS

| | | | |
|---|---|---|---|
| 2007/0023851 A1* | 2/2007 | Hartzell | ............... B81C 1/00246 257/E27.111 |
| 2011/0187674 A1* | 8/2011 | Baker | ..................... G06F 3/041 345/173 |
| 2012/0092279 A1 | 4/2012 | Martin | |
| 2012/0313860 A1* | 12/2012 | Hashimura | ............ B82Y 15/00 977/773 |

(Continued)

*Primary Examiner* — Bryan P Gordon
(74) *Attorney, Agent, or Firm* — Maschoff Brennan

(57) ABSTRACT

A multi-modal sensing transducer may include a force concentrator having an external sensing surface. The multi-modal sensing transducer may also include at least one electrode coupled to the force concentrator. Further, the multi-modal sensing transducer may include at least one force sensitive element disposed adjacent to the at least one electrode. Moreover, the multi-modal sensing transducer may include at least one air gap disposed between the at least one electrode and the at least one force sensitive element.

20 Claims, 9 Drawing Sheets

(56) References Cited

U.S. PATENT DOCUMENTS

| | | |
|---|---|---|
| 2014/0000165 A1 | 1/2014 | Patel et al. |
| 2014/0317722 A1 | 10/2014 | Tartz et al. |
| 2016/0153857 A1 | 6/2016 | Matsuzawa |
| 2017/0131160 A1* | 5/2017 | Lu ..................... G01L 5/0052 |
| 2017/0146414 A1* | 5/2017 | Ben Abdelaziz ......... G01L 5/22 |
| 2017/0322290 A1* | 11/2017 | Ng ..................... H10N 30/2047 |
| 2018/0312393 A1* | 11/2018 | Abbasi Gavarti .. B81C 1/00269 |
| 2019/0043920 A1* | 2/2019 | Berger ................. H10N 30/308 |

* cited by examiner

MULTI-MODAL SENSING TRANSDUCERS

FIELD

The embodiments discussed herein are related to multi-modal sensing transducers.

BACKGROUND

Conventional force sensing devices or transducers may be used to detect an external force magnitude or an amplitude of a force that is being applied on a sensing surface of the device or transducer. Conventional force sensing devices or transducers are typically used on flat or planar surfaces and may not produce accurate reading when used with irregular or curved surfaces.

The subject matter claimed herein is not limited to embodiments that solve any disadvantages or that operate only in environments such as those described above. Rather, this background is only provided to illustrate one example technology area where at least one embodiment described herein may be practiced.

BRIEF DESCRIPTION OF THE DRAWINGS

Example embodiments will be described and explained with additional specificity and detail through the use of the accompanying drawings in which.

DESCRIPTION OF EMBODIMENTS

Conventional force sensing devices or transducers may be used to provide detection of an external force, such as by detecting a magnitude or amplitude of the force that is being applied to a sensing surface of the force sensing device or transducer. Conventional force sensing devices are typically limited to sensing force on a flat surface. Further, activation of conventional force sensing devices may require direct physical contact between an external object and the force sensing device. Another drawback of conventional force sensing devices is that implementation of force sensing on non-planar or curved surfaces is complex and challenging due to many factors including undesirable and/or uncontrollable mechanical pre-load.

Aspects of the present disclosure address these and other shortcomings by providing multi-modal sensing transducers. In various embodiments of the present disclosure, a multi-modal sensing transducer may provide multiple sensing functions including proximity sensing, touch sensing, and variable force sensing. The multi-modal sensing transducer may reduce undesirable and/or uncontrollable mechanical force pre-load. The multi-modal sensing transducer may include a customizable force concentrator for application specific surfaces including conformal 3-dimensional surfaces. A force sensing performance of the multi-modal sensing transducer may be modified by customization of the force concentrator layer design and/or a selection of Young's modulus/stiffness property, among other customizable features. The multi-modal sensing transducer may be "cut to length" within pre-defined segments (e.g., prior to end termination and connector interfacing). The multi-modal sensing transducer may be used for mechanical tactile feedback for use in various types of electronic components. For example, the multi-modal sensing transducer may be used in human machine interface applications, such as a computer interface key (e.g., a keyboard, touch screen, etc.). The multi-modal sensing transducer may be used in conjunction with a curved or non-planar display device so as to enable nearly the entire surface of the curved or non-planar display device to operate as a touch-enabled device.

Embodiments of the present disclosure are further described with reference to the accompanying drawings.

Figure 1:
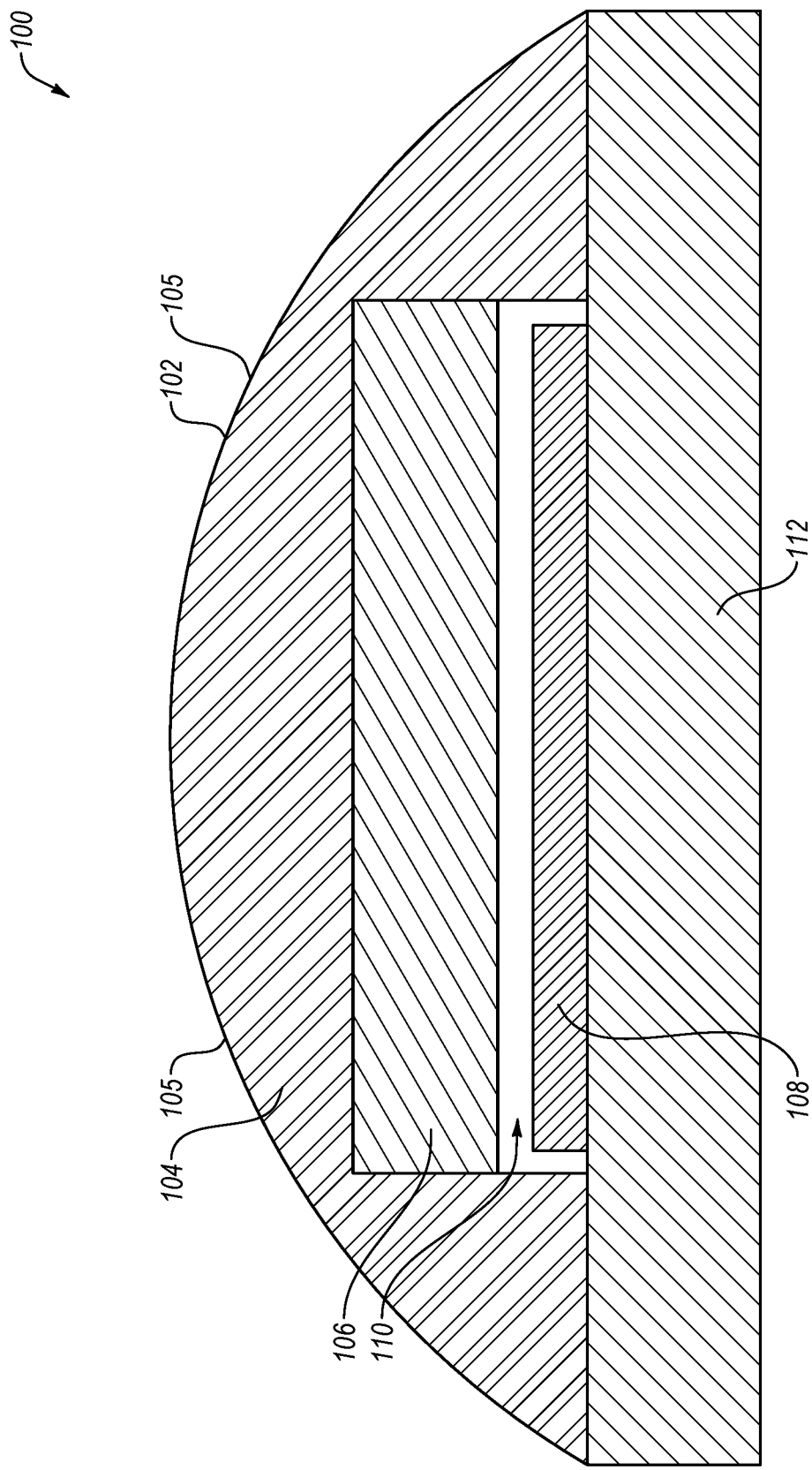
FIG. 1 illustrates an arrangement of an example physical stack-up topology of a multi-modal sensing transducer.

FIG. 1 illustrates an arrangement of an example physical stack-up topology of a multi-modal sensing transducer 100. The multi-modal sensing transducer 100 may include an external sensing surface 102 and a force concentrator 104. In at least some embodiments, the force concentrator 104 may include the sensing surface 102. The multi-modal sensing transducer 100 may further include at least one electrode 106, at least one force sensitive element 108, at least one air gap 110, and a base housing 112.

The external sensing surface 102 may include an externally facing surface upon which a force may be applied. The external sensing surface 102 may be formed from any type of material. For example, the external sensing surface 102 may be formed from a plastic, such as an elastomer. The external sensing surface 102 may be rigid, semi-flexible or flexible. As illustrated, the sensing surface 102 may include a rounded or curved surface. In at least one embodiment, the external sensing surface 102 may include an outer layer or an outer portion of the force concentrator 104.

In some embodiments, the external sensing surface 102 may include one or more contact interfaces (or touch points) 105. A contact interface 105 may be configured to receive a touch input from a user. In some embodiments, the physical and electronic arrangement of contact interfaces 105 may provide detection and measurement of an input force profile related to one or more user touch parameters. In at least one embodiment, each of a set of user contact interfaces (e.g., contact interfaces 105) may operate independently. In some embodiments, the contact interfaces 105 may be spaced apart from each other so as to receive independent input. For example, a first user contact interface may correspond to a first function, such as rolling down a vehicle window while a second user contact interface may correspond to a second function, such as locking a door in the vehicle. In at least one other embodiment, each of the user contact interfaces 105 operate together. For example, the first and second contact interfaces may be simultaneously activated to perform a third function, such as opening/closing a rear hatch of the vehicle.

The force concentrator 104 may include a feature of the multi-modal sensing transducer 100 that may transfer a force applied to the external sensing surface to the force sensitive element 108. The force concentrator 104 may be formed from any type of material. For example, the force concentrator 104 may be formed from a plastic, such as an elastomer. The force concentrator 104 may be formed as any shape. As illustrated, the force concentrator 104 may be formed with a rounded or curved surface.

In at least one embodiment, the external surface 102 and/or the force concentrator 104 may be formed from a transparent, translucent, or selectively transparent material to enable surface illumination of embedded lighting elements (not illustrated). In some embodiments, the embedded lighting elements may be used an indicators for various functions and operations. Further, for example, the embedded lighting elements may change color or state based on different functions and operations. For example, an embedded lighting element may display or illuminate a "locked" symbol when vehicle doors are locked and an "unlocked" symbol when the vehicle doors are unlocked. Similarly, the embedded lighting element may display or illuminate a colored lock symbol with a first color when the vehicle doors are locked and may display or illuminate the colored lock symbol with a second color when the vehicle doors are unlocked. In at least one embodiment, an embedded lighting element may change color or state depending on a status of the vehicle. For example, the embedded lighting element may emit a first color when the vehicle is on and the engine is running. Further, for example, the embedded lighting element may emit a second, different color when the vehicle is on and the engine is not running.

The electrode 106, which may also be referred to herein as an "electrode layer," may include an electrically conductive material that may be configured to detect a capacitance change when a dielectric object (e.g., a human finger) is within close physical proximity (or in contact with) to the transducer 100. In at least one embodiment, the electrode 106 may be configured to detect a capacitance change when a dielectric object (e.g., a human finger) is within close physical proximity to the transducer 100 without being in direct physical contact with the external surface 102 and/or the force concentrator 104.

The force sensitive element 108 may include an electrically responsive element where an electrical output of the electrically responsive element may vary with force being applied to transducer 100. An example force sensitive element includes a piezoresistive sensor, where a resistance output reduction may be proportional to the external force being applied to the sensor. The force sensitive element 108 may be configured to sense force characteristics including but not limited to force magnitude, rise time, fall time, and/or hold time.

The air gap 110 may be shaped and configured to reduce physical contact between the electrode 106 and the force sensitive element 108, unless an external force that exceeds a force threshold is applied to the sensing surface 102. The air gap 110 may also be shaped and sized to allow the multi-modal sensing transducer 100 to bend or flex without the electrode 106 coming in contact with the force sensitive element 108. In at least one embodiment, the air gap 110 may be shaped and sized to allow a particular amount of flex of the electrode 106 and the force sensitive element 108 before the electrode 106 contacts the force sensitive element 108. In at least one embodiment, the air gap 110 may be substantially rectangular. In other embodiments, the air gap 110 may be any shape or size. In at least one embodiment, the air gap 110 may be shaped and sized to resemble geometry of one or both of the electrode 106 and/or the force sensitive element 108.

The base housing 112, which may include any material, may include a rigid or semi-rigid member that may be configured to provide support for the multi-modal sensing transducer 100.

The topology of the multi-modal sensing transducer 100 may be configured for various functional sensing modes. For example, the multi-modal sensing transducer 100 may be configured for proximity detection, variable air gap mode, discrete contact mode, variable contact mode, among others. Some of these various modes are further described in conjunction with FIGS. 4 and 5.

In a particular physical configuration, the force concentrator 104 may be designed as a discrete force sensing object with deformation property (such as elastomer, etc.), the electrode 106 may be designed as a pair of interdigitated conductive layers (e.g., etched copper film, printed silver on film, directly deposited, etc.) and the force sensitive element 108 may be designed as a film with deposited electrically responsive material (such as piezoresistive, etc.).

The multi-modal sensing transducer 100 may also include one or more haptic feedback elements (not illustrated). One or more haptic feedback elements may be integrated directly in contact with the external surface 102. This approach may enable a user to experience haptic force feedback derived from, or related to, force sensing. In some embodiments, the haptic feedback element may include a haptic feedback driver and/or a haptic actuator. The haptic feedback driver may receive and process input received via the force sensing element 108 and may translate the input into a haptic response. The haptic response may be any type of physical response, optical (e.g., light-based) response, audible response, or any combination thereof. The haptic feedback driver may communicate the haptic response to the haptic actuator. The haptic actuator may perform the haptic response (e.g., provide a vibration, feedback motion, audible and/or visual response) via the multi-modal sensing transducer 100.

In some embodiments, the multi-modal sensing transducer 100 (and/or the one or more force sensing elements) may be configured to receive and interpret different inputs from an operator of the multi-modal sensing transducer 100. For example, the multi-modal sensing transducer 100 may be configured to receive and interpret different inputs to control different operations associated with, for example, a vehicle, such as door locking/latching, unlocking/unlatching, starting the vehicle ignition, opening a door or trunk, enabling or disabling a vehicle alarm system, opening or closing vehicle windows, climate control, cruise control, window actuation, stereo and video control, and the like. The multi-modal sensing transducer 100 may be configured to provide a different haptic response for each different input. For example, the multi-modal sensing transducer 100 may provide a first vibration pattern to a user upon receiving an input to unlock the vehicle doors. The multi-modal sensing transducer 100 may provide a second vibration pattern upon receiving an input to lock the vehicle doors.

Modifications, additions, or omissions may be made to the multi-modal sensing transducer 100 without departing from the scope of the present disclosure. For example, in at least one embodiment, the multi-modal sensing transducer 100 may include any number of other components that may not be explicitly illustrated or described.

Figure 2A:
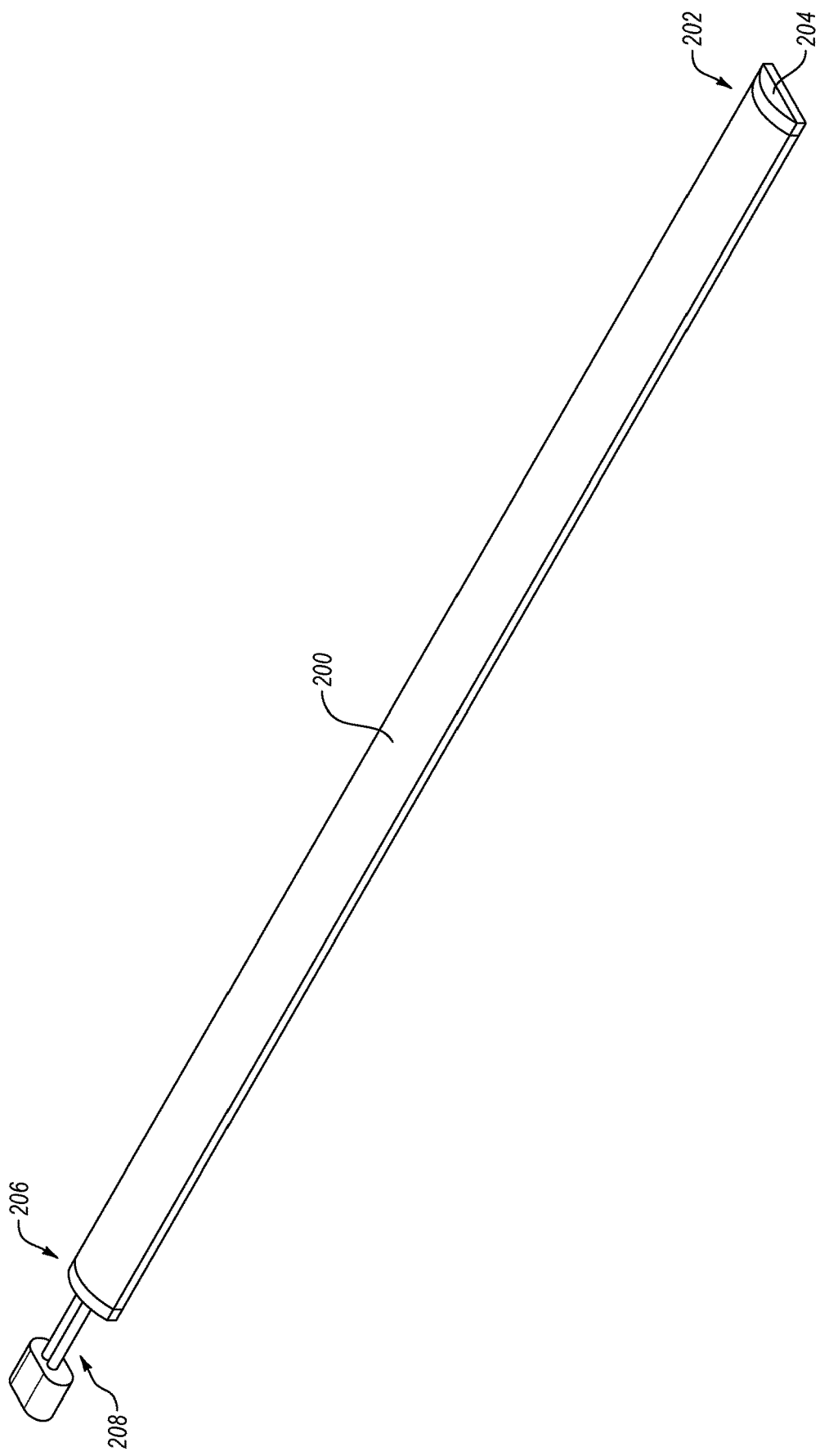
FIGS. 2A-2D show examples of electrical interfaces for a multi-modal sensing transducer.
Figure 2B:
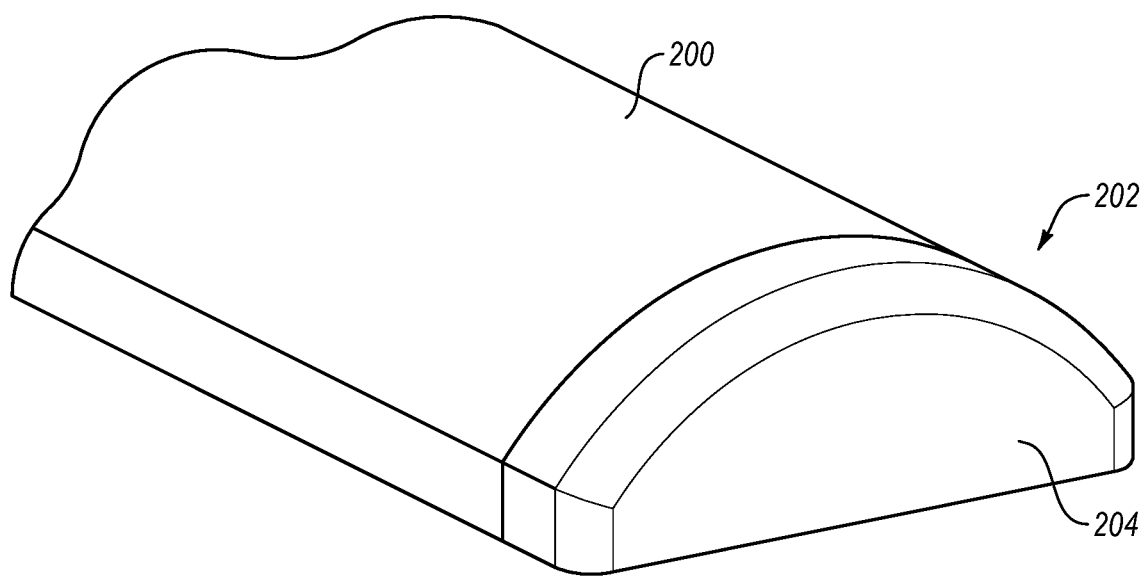
Figure 2C:
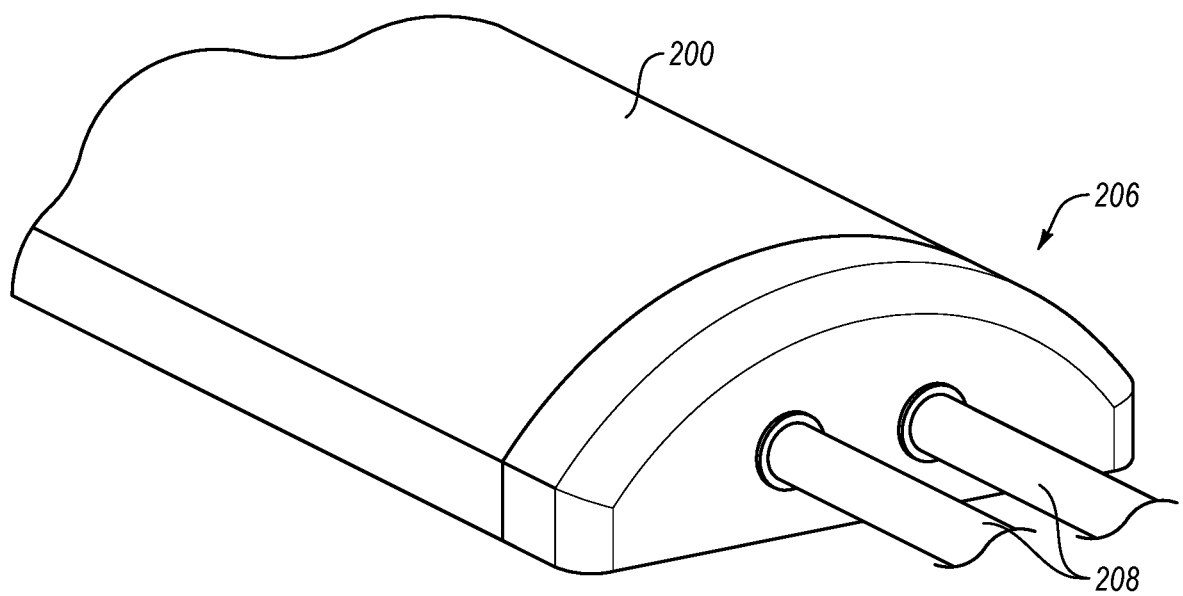
Figure 2D:
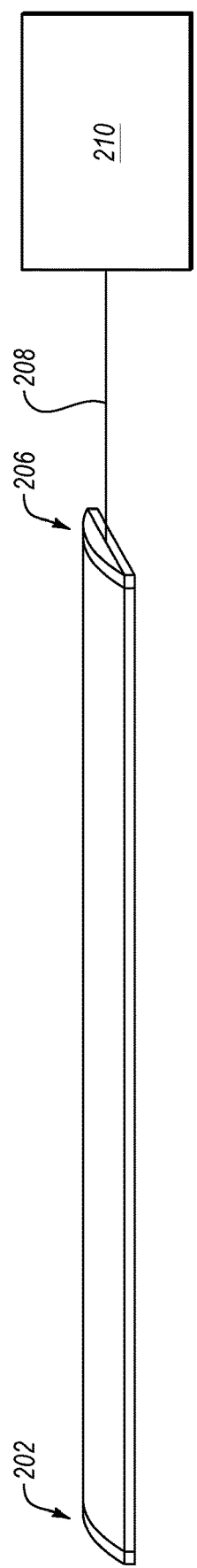

FIGS. 2A-2D show an example of electrical interfaces for a multi-modal sensing transducer 200, which may include the multi-modal sensing transducer 100 of FIG. 1. In some embodiments, at illustrated in FIGS. 2A and 2B, one end 202 of the multi-modal sensing transducer 200 may be terminated. For example, the terminated end 202 may include an end cap 204. As illustrated in FIGS. 2A, 2C, and 2D, another end 206 of the multi-modal sensing transducer 200 may be connected to a one or more (e.g., a pair) of electrical connectors 208 that may be interfaced to an external circuit board 210 (shown in FIG. 2D).

Figure 3B:
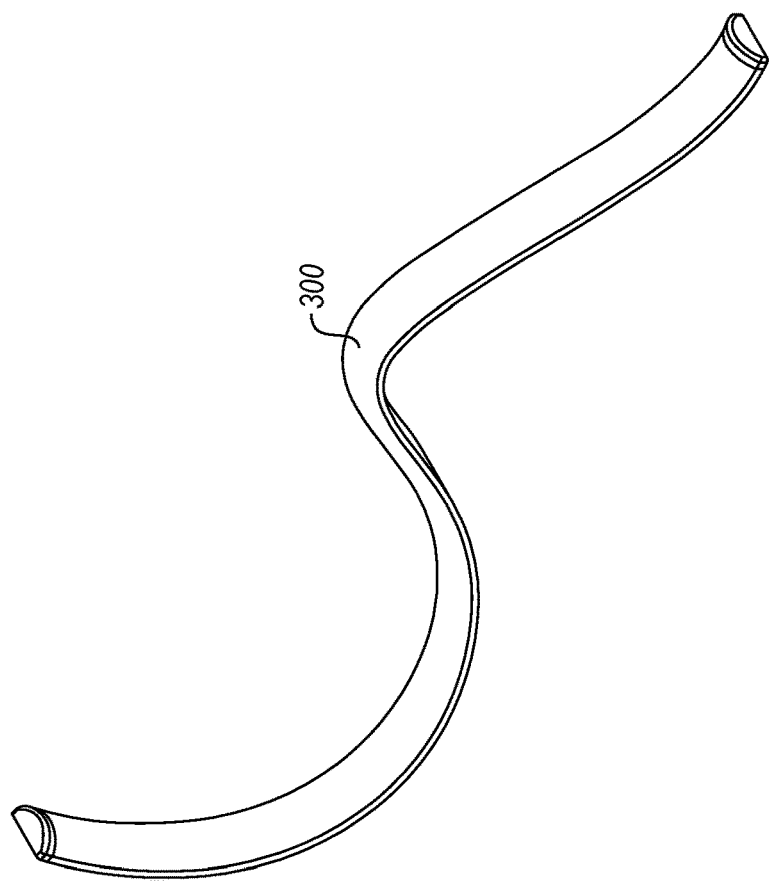
FIGS. 3A and 3B show alternative form factors for a multi-modal sensing transducer, including flexible shape configurations.
Figure 3A:
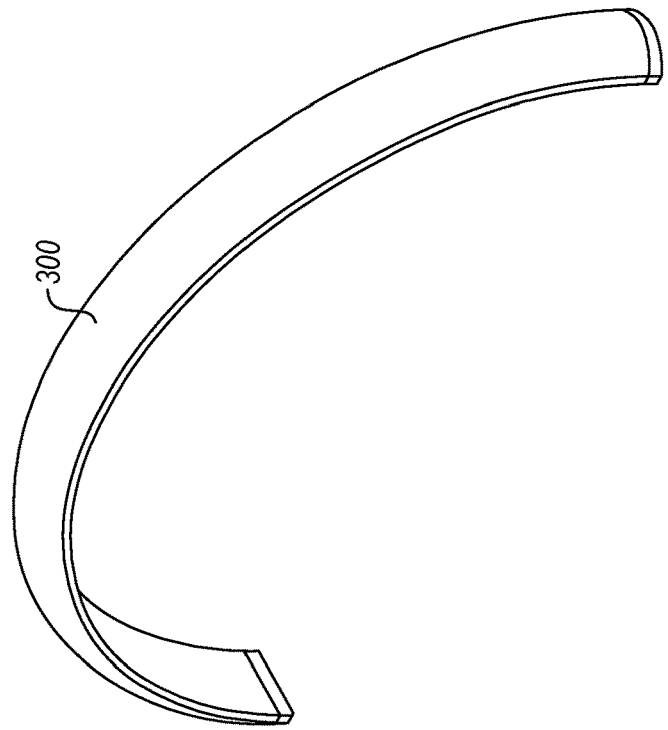

FIGS. 3A and 3B show alternative form factors for a multi-modal sensing transducer 300 (e.g., the multi-modal sensing transducer 100 of FIG. 1), including flexible shape configurations. The multi-modal sensing transducer 300 may be formed in any shape. Further, the multi-modal sensing transducer 300 may be flexible such that an external force may flex or bend the multi-modal sensing transducer 300.

For example, a multi-modal sensing transducer (e.g., the multi-modal sensing transducer 100 of FIG. 1) may be configurable between any number of configurations. In one example, the multi-modal sensing transducer may be configured in a proximity detection mode of human touch where there is no direct physical contact with the external surface of the force concentrator (e.g., force concentrator 104 of FIG. 1). As an example, this function may be achieved by projected capacitance detection by applying electric field stimulus to one or more electrode elements (e.g., electrode 106 of FIG. 1).

In another example, the multi-modal sensing transducer may be configured in a variable air gap mode where physical contact with the external surface of the force concentrator may result in a reduction of an air gap (e.g., air gap 110 of FIG. 1), which may be dependent on a magnitude and/or direction of the applied external force. As an example, this function may be achieved by measuring capacitance between one or more electrode elements (e.g., electrode 106 of FIG. 1) and a force sensitive element (e.g., the force sensitive element 108 of FIG. 1). The air gap reduction may be proportional to the external force being applied onto the external surface (e.g., the sensing surface 102 of FIG. 1) of the force concentrator (e.g., the force concentrator 104 of FIG. 1), which, in some embodiments, may result in elastomer deformation of at least a portion of the multi-modal sensing transducer.

In yet another example, the multi-modal sensing transducer may be configured in a discrete contact mode where physical contact with the external surface of the force concentrator may result in electrical interface between the electrode and the force sensitive element, which may be dependent on the applied external force. As an example, this function may be achieved when the external force being applied onto the sensing surface (e.g., sensing surface 102 of FIG. 1) results in significant elastomer deformation.

In yet another example, the multi-modal sensing transducer may be configured in a variable contact mode where physical contact with the external surface of the force concentrator may result in variable interfacial surface area between the electrode and force sensitive element, which may result in a variable electrical output response. As an example, this function may be achieved when the external force being applied onto the sensing surface results in varying the elastomer deformation.

Figure 4:
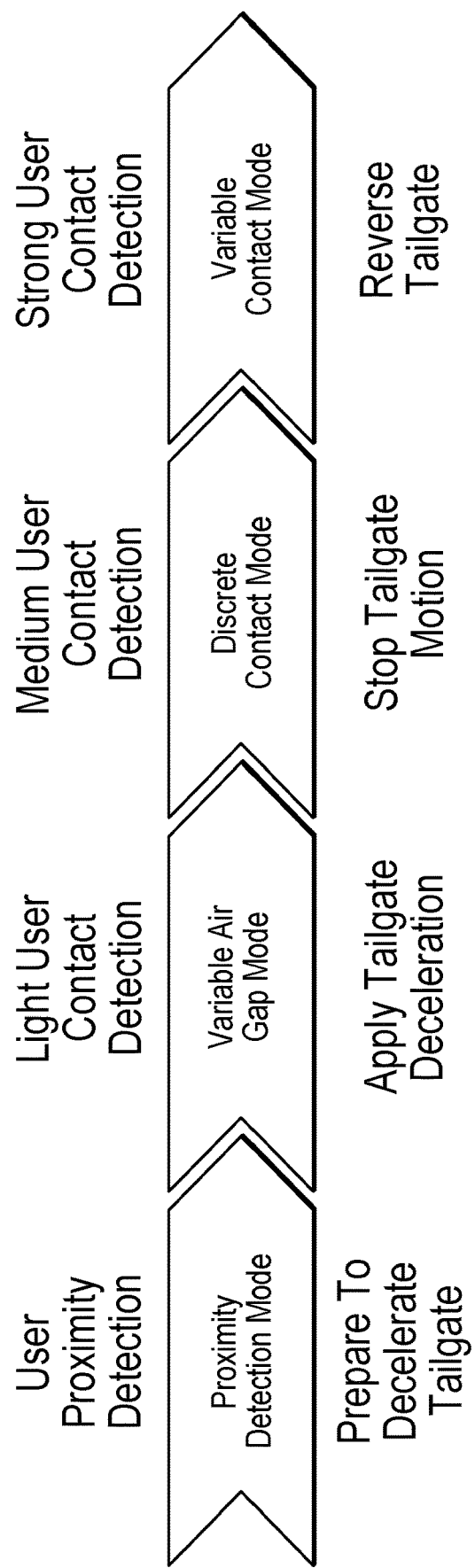
FIG. 4 illustrates an application example of implementing functional sensing modes in collision warning and collision detection for a vehicle tailgate safety system including one or more multi-modal sensing transducers.

With reference to FIG. 4, an application example of implementing functional sensing modes in collision warning and collision detection for a vehicle tailgate safety system (e.g., to reduce potential injury to users) will now be described. For example, the collision warning and collision detection may reduce injury (e.g., hand/arm pinching) caused to a user by a vehicle tailgate.

FIG. 4 illustrates various modes in which a multi-modal sensing transducer may be configured for the vehicle tailgate safety system. In a proximity detection mode, an electrode layer (e.g., electrode 106 of FIG. 1) of a transducer (e.g., the multi-modal sensing transducer 100 of FIG. 1) may be used to detect projected capacitance change when a dielectric object (e.g., a human finger) is within close physical proximity to the transducer without direct physical contact with the external surface of a force concentrator (e.g., the force concentrator 104 of FIG. 1). This may represent a 1st stage of safety system implementation: collision warning. In some embodiments, the vehicle tailgate control system may be programmed to reduce the speed/torque of the vehicle tailgate (e.g., gradually decelerating the tailgate and to activate an audible warning). This may be used to warn the user of potential hand/arm pinching.

In a variable air gap mode, physical contact with the external surface of the force concentrator may result in an air gap reduction, which may be dependent on the magnitude of external force applied. The variable air gap (e.g., the air gap 110 of FIG. 1) may result in variable capacitance between the electrode layer and a force sensitive element (e.g., the force sensitive element 108 of FIG. 1). This may represent a 2nd stage of safety system implementation: collision detection when a low contact force is detected. In some embodiments, the vehicle tailgate control system may be programmed to apply rapid deceleration of the vehicle tailgate. Rapid deceleration may minimize potential hand/arm pinching to the user.

In a discrete contact mode, physical contact with the external surface of the force concentrator may result in electrical interface between the electrode and the force sensitive element, which may be dependent on the magnitude of external force applied. This may represent a 3rd stage of safety system implementation: collision detection when intermediate contact force may be detected. In some embodiments, the vehicle tailgate control system may be programmed to stop the vehicle tailgate movement and, thus, potential hand/arm pinching may be reduced. The vehicle tailgate control system may also be used to lock the tailgate in a specific inclination.

In a variable contact mode, physical contact with the external surface of the force concentrator may result in variable interfacial surface area between the electrode and the force sensitive element. This may represent a 4th stage of safety system implementation: collision detection when large contact force may be detected. In some embodiments, the vehicle tailgate control system may be programmed to reverse the vehicle tailgate motion and, thus, a potential hand/arm pinching may be reduced. The vehicle tailgate control system may also be used to re-open the tailgate.

Figure 5:
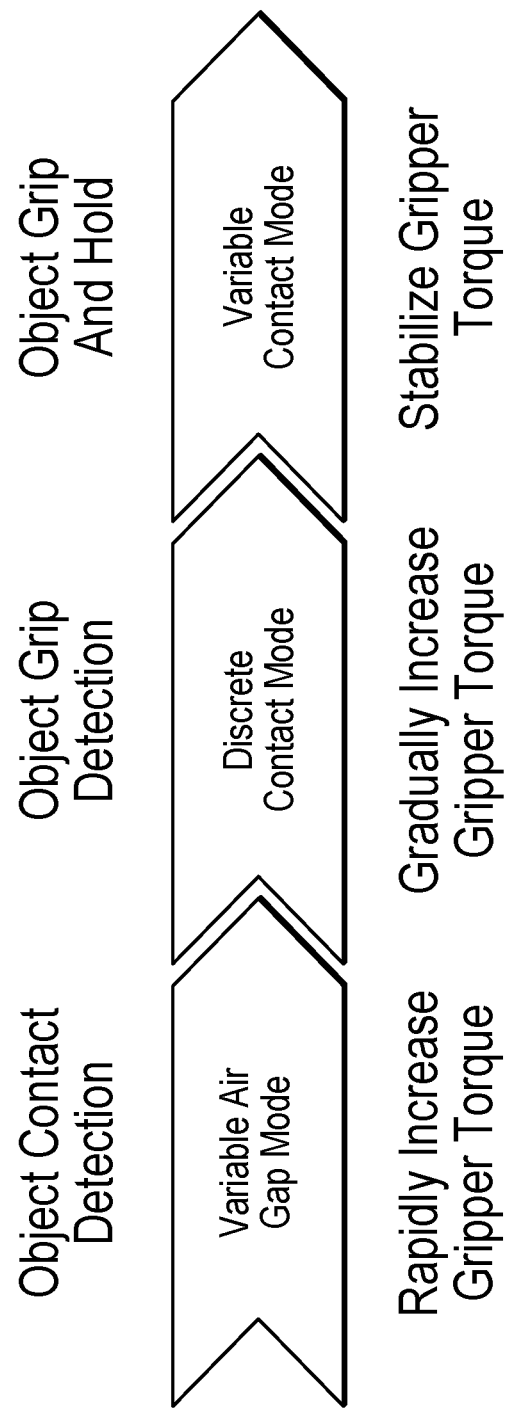
FIG. 5 illustrates an application example of implementing functional sensing modes in a robotic gripper system including one or more multi-modal sensing transducers.

FIG. 5 illustrates an application example of implementing functional sensing modes in a robotic gripper system. FIG. 5 illustrates various modes in which a multi-modal sensing transducer may be configured for the robotic gripper system. More specifically, in this example, three functional sensing modes are implemented to enhance object "grip and pick:" (1) variable air gap mode, (2) discrete contact mode and (3) variable contact mode.

In a variable air gap mode, physical contact with an external surface (e.g., sensing surface 102 of FIG. 1) of a force concentrator (e.g., force concentrator 104 of FIG. 1) may result in air gap reduction (e.g., reduction of air gap 110 of FIG. 1), which may be dependent on the magnitude of reactive force applied. The variable air gap may result in variable capacitance between an electrode layer (e.g., electrode 106 of FIG. 1) and a force sensitive element (e.g., force sensitive element 108 of FIG. 1). This may represent a 1st stage of object gripping detection when low reactive force may be detected. In some embodiments, the robotic control system may be programmed to rapidly increase the applied force of a robotic gripper.

In a discrete contact mode, physical contact with the external surface of the force concentrator may result in electrical interface between the electrode and the force sensitive element, which may be dependent on the magnitude of external force applied. This may represent a 2nd stage of object gripping detection when intermediate reactive force may be detected. In some embodiments, the robotic control system may be programmed to slowly increase the applied force of the robotic gripper.

In a variable contact mode, physical contact with the external surface of the force concentrator may result in variable interfacial surface area between the electrode and the force sensitive element. This may represent the 3rd stage of object gripping detection when intermediate reactive force may be detected. In some embodiments, the robotic control system may be programmed to maintain the applied force of the robotic gripper.

Figure 6:
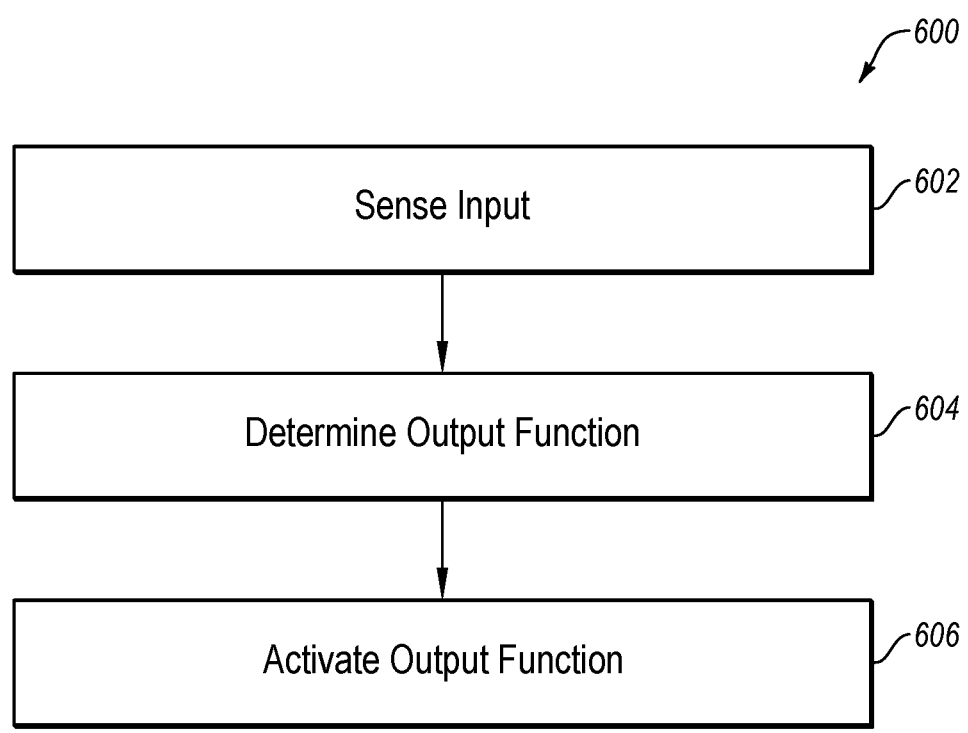
FIG. 6 illustrates an example method for input sensing, computational processing of input sensing, and interactive functional control of a system by operation of a multi-modal sensing transducer.

FIG. 6 illustrates a flow diagram of an example method that may be used in conjunction with a multi-modal transducer, such as any of the multi-modal transducers further described in conjunction with FIGS. 1-3. One or more acts of the method of FIG. 6 may be performed by processing logic that may include hardware (circuitry, dedicated logic, etc.), software (such as is run on a general purpose computer system or a dedicated machine), or a combination of both, which processing logic may be included in a computer system or device. For simplicity of explanation, methods described herein are depicted and described as a series of acts. However, acts in accordance with this disclosure may occur in various orders and/or concurrently, and with other acts not presented and described herein. Further, not all illustrated acts may be required to implement the methods in accordance with the disclosed subject matter. In addition, those skilled in the art will understand and appreciate that the methods may alternatively be represented as a series of interrelated states via a state diagram or events. Additionally, the methods disclosed in this specification are capable of being stored on an article of manufacture, such as a non-transitory computer-readable medium, to facilitate transporting and transferring such methods to computing devices. The term article of manufacture, as used herein, is intended to encompass a computer program accessible from any computer-readable device or storage media. Although illustrated as discrete blocks, various blocks may be divided into additional blocks, combined into fewer blocks, or eliminated, depending on the desired implementation.

FIG. 6 illustrates an example method 600 for input sensing, computational processing of input sensing, and interactive functional control of a system (e.g., vehicle, vehicle tailgate safety system, robotic gripper system, etc.) by operation of a multi-modal sensing transducer.

The method of FIG. 6 may begin at block 602, wherein an input may be sensed via a multi-modal sensing transducer. For example, the input may be sensed using a force concentrator, an electrode, an air gap, and/or a force sensitive element, as described in conjunction with FIGS. 1-3. As described herein, the multi-modal sensing transducer may sense an input via a proximity detection mode, a variable air gap mode, a discrete contact mode, a variable contact mode, or any combination thereof.

In at least the variable air gap mode, the discrete contact mode, and the variable contact mode, the input may include a force applied to a sensing surface (e.g., sensing surface 102 of FIG. 1) of a force concentrator (e.g., force concentrator 104 of FIG. 1). In at least the proximity detection mode, the input may include a dielectric object (e.g., a human finger) positioned in close proximity to the sensing surface. Further, for example, the input may be sensed via detecting at least one of a change in capacitance, a variable capacitance between an electrode (e.g., the electrode 106 of FIG. 1) and a force sensitive element (e.g., the force sensitive element 108 of FIG. 1), an electrical interface between the electrode and the force sensitive element, and/or a variable interfacial surface area between the electrode and the force sensitive element.

At block 604, an output function may be determined based on the sensed input. For example, the output function may be based on an electrical output generated via an electrically responsive element of the force sensitive element 108 (see FIG. 1). For example, the processing logic may determine that the sensed input corresponds to particular output, such as a vehicle function.

At block 606, the output function may be activated. In at least some embodiments, the output function may include a vehicle function and the processing logic may perform the vehicle function or may cause the vehicle function to be performed, via the vehicle and/or via the multi-modal sensing transducer. For example, the output function may include door locking/latching, unlocking/unlatching, starting the vehicle ignition, opening a door or trunk, enabling or disabling a vehicle alarm system, opening or closing vehicle windows, climate control, cruise control, window actuation, stereo and video control, and the like.

Figure 7:
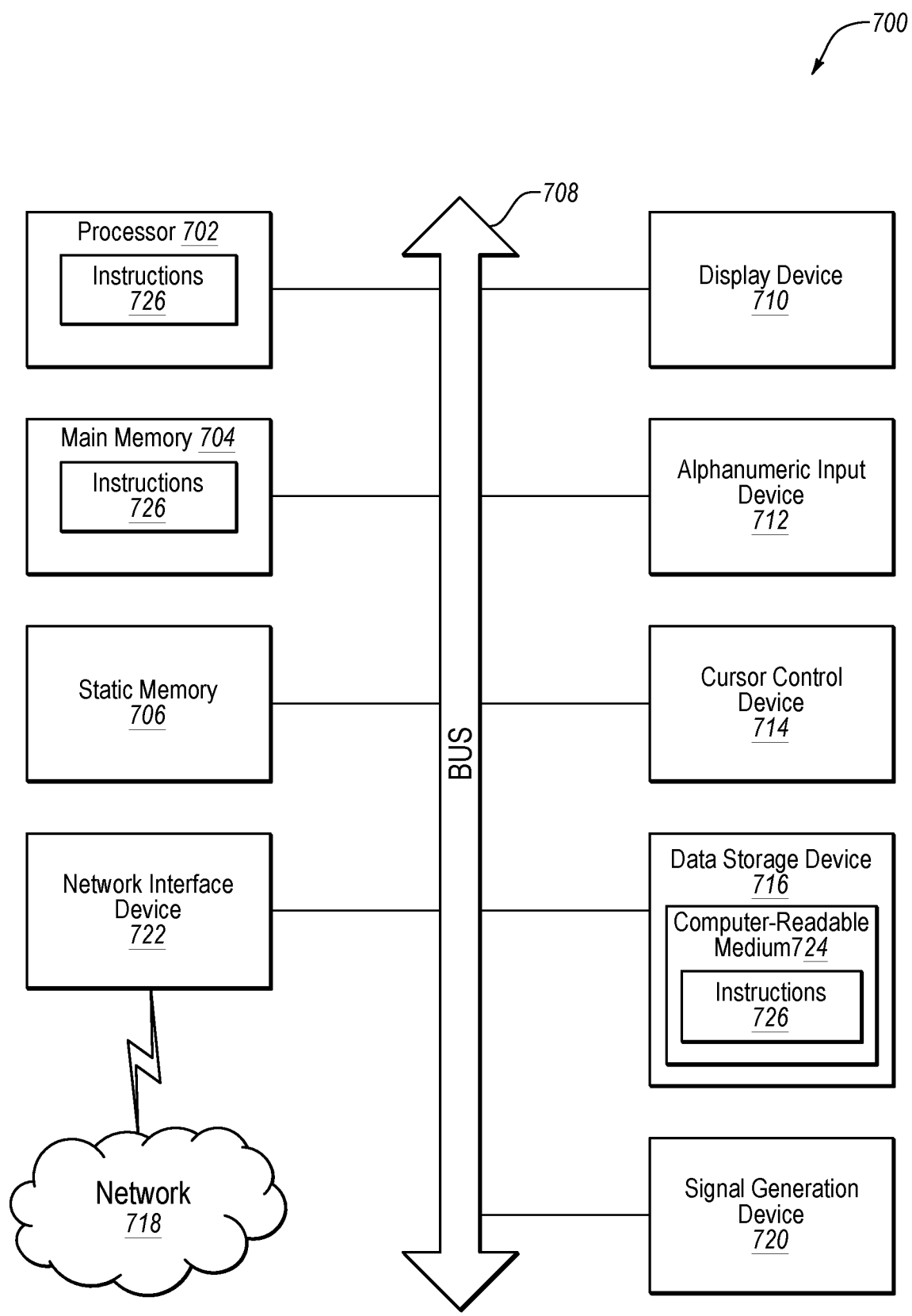
FIG. 7 illustrates a block diagram of an example computer system, all according to at least one embodiment of the present disclosure.

FIG. 7 illustrates a block diagram of an example computer system 700 related to a multi-modal transducer, according to at least one embodiment of the present disclosure. The multi-modal transducer of FIG. 1 may be implemented as a computing system such as the example computer system 700. The computer system 700 may be configured to implement one or more operations of the present disclosure.

The computer system 700 executes one or more sets of instructions 726 that cause the machine to perform any one or more of the methods discussed herein. The machine may operate in the capacity of a server or a client machine in client-server network environment, or as a peer machine in a peer-to-peer (or distributed) network environment. The machine may be a personal computer (PC), a tablet PC, a set-top box (STB), a personal digital assistant (PDA), a mobile telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute the sets of instructions 726 to perform any one or more of the methods discussed herein.

The computer system 700 includes a processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage device 716, which communicate with each other via a bus 708.

The processor 702 represents one or more general-purpose processing devices such as a microprocessor, central processing unit, or the like. More particularly, the processor

702 may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processor 702 may also be one or more special-purpose processing devices such as an application specific integrated circuit (ASIC), a field programmable gate array (FPGA), a digital signal processor (DSP), network processor, or the like. The processor 702 is configured to execute instructions for performing the operations and steps discussed herein.

The computer system 700 may further include a network interface device 722 that provides communication with other machines over a network 718, such as a local area network (LAN), an intranet, an extranet, or the Internet. The network interface device 722 may include any number of physical or logical interfaces. The network interface device 722 may include any device, system, component, or collection of components configured to allow or facilitate communication between network components in a network. For example, the network interface device 722 may include, without limitation, a modem, a network card (wireless or wired), an infrared communication device, an optical communication device, a wireless communication device (such as an antenna), and/or chipset (such as a Bluetooth device, an 802.7 device (e.g. Metropolitan Area Network (MAN)), a WiFi device, a WiMax device, cellular communication facilities, etc.), and/or the like. The network interface device 722 may permit data to be exchanged with a network (such as a cellular network, a WiFi network, a MAN, an optical network, etc., to name a few examples) and/or any other devices described in the present disclosure, including remote devices. In at least one embodiment, the network interface device 722 may be logical distinctions on a single physical component, for example, multiple communication streams across a single physical cable or optical signal.

The computer system 700 also may include a display device 710 (e.g., a liquid crystal display (LCD) or a cathode ray tube (CRT)), an alphanumeric input device 712 (e.g., a keyboard), a cursor control device 714 (e.g., a mouse), and a signal generation device 720 (e.g., a speaker).

The data storage device 716 may include a computer-readable storage medium 724 on which is stored the sets of instructions 726 embodying any one or more of the methods or functions described herein. The sets of instructions 726 may also reside, completely or at least partially, within the main memory 704 and/or within the processor 702 during execution thereof by the computer system 700, the main memory 704 and the processor 702 also constituting computer-readable storage media. The sets of instructions 726 may further be transmitted or received over the network 718 via the network interface device 722.

While the example of the computer-readable storage medium 724 is shown as a single medium, the term "computer-readable storage medium" may include a single medium or multiple media (e.g., a centralized or distributed database, and/or associated caches and servers) that store the sets of instructions 726. The term "computer-readable storage medium" may include any medium that is capable of storing, encoding or carrying a set of instructions for execution by the machine and that cause the machine to perform any one or more of the methods of the present disclosure. The term "computer-readable storage medium" may include, but not be limited to, solid-state memories, optical media, and magnetic media.

Modifications, additions, or omissions may be made to the computer system 700 without departing from the scope of the present disclosure. For example, in at least one embodiment, the computer system 700 may include any number of other components that may not be explicitly illustrated or described.

As used in the present disclosure, the terms "module" or "component" may refer to specific hardware implementations configured to perform the actions of the module or component and/or software objects or software routines that may be stored on and/or executed by general purpose hardware (e.g., computer-readable media, processing devices, etc.) of the computing system. In at least one embodiment, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated. In the present disclosure, a "computing entity" may be any computing system as previously defined in the present disclosure, or any module or combination of modulates running on a computing system.

Terms used in the present disclosure and especially in the appended claims (e.g., bodies of the appended claims) are generally intended as "open" terms (e.g., the term "including" may be interpreted as "including, but not limited to," the term "having" may be interpreted as "having at least," the term "includes" may be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases may not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" may be interpreted to mean "at least one" or "one or more"); the same holds true for the use of definite articles used to introduce claim recitations.

In addition, even if a specific number of an introduced claim recitation is explicitly recited, those skilled in the art will recognize that such recitation may be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, may be understood to contemplate the possibilities of including one of the terms, either of the terms, or both terms. For example, the phrase "A or B" may be understood to include the possibilities of "A" or "B" or "A and B."

All examples and conditional language recited in the present disclosure are intended for pedagogical objects to aid the reader in understanding the invention and the concepts contributed by the inventor to furthering the art, and are to be construed as being without limitation to such specifically recited examples and conditions. Although embodiments of the present disclosure have been described in detail, various changes, substitutions, and alterations may be made hereto without departing from the spirit and scope of the present disclosure.

What is claimed is:

1. A multi-modal sensing transducer, comprising:
a force concentrator having an external sensing surface;
at least one electrode coupled to the force concentrator;
at least one force sensitive element disposed adjacent to the at least one electrode; and
at least one air gap disposed between the at least one electrode and the at least one force sensitive element.

2. The multi-modal sensing transducer of claim 1, wherein the force concentrator comprises elastomer.

3. The multi-modal sensing transducer of claim 1, wherein the external sensing surface comprises one or more contact interfaces.

4. The multi-modal sensing transducer of claim 3, wherein each contact interface of one or more contact interfaces is configured to be activated to perform an associated function.

5. The multi-modal sensing transducer of claim 1, wherein the force sensitive element comprises a piezoresistive sensor.

6. The multi-modal sensing transducer of claim 1, further comprising at least one electrical interface including one or more electrical connectors.

7. The multi-modal sensing transducer of claim 1, further comprising a base housing coupled to the at least one force sensitive element.

8. The multi-modal sensing transducer of claim 1, wherein the external sensing surface comprises a curved surface.

9. A system, comprising
a circuit board; and
a multi-modal sensing transducer coupled to the circuit board and comprising:
a force concentrator having an external sensing surface;
at least one electrode coupled to the force concentrator;
at least one force sensitive element disposed adjacent to the at least one electrode; and
at least one air gap disposed between the at least one electrode and the at least one force sensitive element.

10. The system of claim 9, wherein the external sensing surface comprises elastomer.

11. The system of claim 9, wherein the external sensing surface comprises one or more contact interfaces.

12. The system of claim 11, wherein each contact interface of one or more contact interfaces is configured to be activated to perform an associated function.

13. The system of claim 9, wherein the force sensitive element comprises a piezoresistive sensor.

14. The system of claim 9, further comprising at least one electrical interface including one or more electrical connectors.

15. The system of claim 9, further comprising a base housing coupled to the at least one force sensitive element.

16. The system of claim 9, wherein the external sensing surface comprises a curved surface.

17. A system, comprising:
a multi-modal sensing transducer comprising:
a force concentrator;
at least one electrode coupled to the force concentrator;
at least one force sensitive element disposed adjacent to the at least one electrode; and
at least one air gap disposed between the at least one electrode and the at least one force sensitive element; and
a processor operatively coupled to the multi-modal sensing transducer, the processor being configured to perform operations comprising:
sensing an input applied to the multi-modal sensing transducer;
determining an output function based on the sensed input; and
causing an activation of the output function.

18. The system of claim 17, wherein the input comprises a force applied to a curved surface of the force concentrator.

19. The system of claim 17, wherein the output function includes an operation of a system.

20. The system of claim 17, wherein the output function is based on an electrical output generated via an electrically responsive element of the at least one force sensitive element.

* * * * *